United States Patent
Janzen et al.

(10) Patent No.: US 7,285,979 B2
(45) Date of Patent: *Oct. 23, 2007

(54) APPARATUS AND METHOD FOR INDEPENDENT CONTROL OF ON-DIE TERMINATION FOR OUTPUT BUFFERS OF A MEMORY DEVICE

(75) Inventors: Jeff Janzen, Meridian, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/588,473

(22) Filed: Oct. 26, 2006

(65) Prior Publication Data

US 2007/0040574 A1    Feb. 22, 2007

Related U.S. Application Data

(63) Continuation of application No. 11/040,577, filed on Jan. 20, 2005, now Pat. No. 7,138,823.

(51) Int. Cl.
*H03K 17/16* (2006.01)
(52) U.S. Cl. .......................... 326/30; 326/83
(58) Field of Classification Search ............... 326/26, 326/30, 82–86
See application file for complete search history.

(56) References Cited

U.S. PATENT DOCUMENTS

| | | | |
|---|---|---|---|
| 6,724,082 B2 | 4/2004 | McCall et al. | 257/723 |
| 6,747,475 B2 | 6/2004 | Yuffe et al. | 326/30 |
| 6,806,728 B2 | 10/2004 | Nguyen et al. | 326/30 |
| 6,807,650 B2 | 10/2004 | Lamb et al. | 716/1 |
| 6,842,035 B2 | 1/2005 | Kurts et al. | 326/30 |
| 7,009,911 B2 | 3/2006 | Morzano et al. | 365/230.06 |
| 7,034,565 B2 | 4/2006 | Lee | 326/30 |
| 2004/0066683 A1 | 4/2004 | Hartmann et al. | 365/200 |
| 2004/0083070 A1 | 4/2004 | Salmon et al. | 702/107 |
| 2004/0100837 A1 | 5/2004 | Lee | 365/200 |
| 2004/0141391 A1 | 7/2004 | Lee et al. | 365/200 |
| 2004/0217774 A1 | 11/2004 | Choe | 326/30 |
| 2004/0228196 A1 | 11/2004 | Kwak et al. | 365/230.03 |
| 2004/0240298 A1 | 12/2004 | Jin | 365/222 |
| 2005/0046442 A1 | 3/2005 | Song | 326/30 |
| 2005/0052200 A1 | 3/2005 | Nguyen et al. | 326/30 |
| 2005/0068800 A1 | 3/2005 | Fahmy et al. | 365/63 |

*Primary Examiner*—Don Le
(74) *Attorney, Agent, or Firm*—Dorsey & Whitney LLP

(57) ABSTRACT

An apparatus and method providing independent control of on-die termination (ODT) of output buffers. The ODTs for the buffer circuits of an input/output (I/O) buffer can be enabled and disabled in response to an ODT control signal. Additionally, the ODTs for a first set of the buffer circuits can be enabled and disabled responsive to the ODT control signal and the ODT for at least one of a second set of the buffer circuits is disabled.

42 Claims, 5 Drawing Sheets

APPARATUS AND METHOD FOR INDEPENDENT CONTROL OF ON-DIE TERMINATION FOR OUTPUT BUFFERS OF A MEMORY DEVICE

CROSS-REFERENCE TO RELATED APPLICATION

This application is a continuation of U.S. patent application Ser. No. 11/040,577, filed Jan. 20, 2005 now U.S. Pat. No. 7,138,823.

TECHNICAL FIELD

The present invention relates generally to semiconductor memory devices, and more specifically, to memory devices having independent control of on-die termination circuits of buffer circuits, such as data strobe and data buffers.

BACKGROUND OF THE INVENTION

Memory devices are typically assembled into memory modules that are used in a computer system. These memory modules typically include single in-line memory modules (SIMMs) having memory devices on one side of the memory module, and dual in-line memory modules (DIMMs) having memory devices on both sides of the memory module. The memory devices of a memory module are accessed in groups. Each of the groups are commonly referred to as "ranks," with single-sided DIMMs typically having one rank of memory devices and double-sided DIMMs having two ranks of memory devices, one rank on either side of the memory module.

Each of the memory devices of a memory module receives a set of signals which is generated by a memory controller to command the memory devices to perform various memory operations. For example, these signals include a clock signal for synchronizing the timing of the memory operations with the memory controller, command signals to direct the memory devices to perform specific memory operations, and address signals to identify a memory location in the memory devices. Additionally, the memory controller can send write data signals for data that are written to the memory device, and write strobe signals for signaling to the memory device the time at which write data is provided to the memory devices by the memory controller. The memory controller also receives signals from the memory devices of a memory module, such as read data signals for data that are retrieved from the memory devices and read strobe signals for signaling to the controller the time at which read data are provided to the memory controller by the memory devices.

As the clock frequencies increase for the memory systems in which the memory devices and memory modules operate, timing and voltage margins for the various signals related to memory device operation become more critical. Subtle variations in signal timing and operating conditions can negatively impact memory device performance. Consequently, it is desirable to improve timing and voltage margins without sacrificing performance, where possible.

An example of an approach to improving timing and voltage margins is the use of on-die terminations (ODT) for input/output buffers, such as data strobe, data, and data mask buffers of the memory devices. The ODT circuits provide resistive terminations that improve voltage margin and signal integrity for both read and write operations. The improved voltage margin also indirectly provides improved timing margin in that the time for which data is valid is increased with the use of ODT. As a result, the "data eye" for memory devices having ODT are generally larger than for memory devices without ODT, which enable systems having these memory devices to attain higher data rates.

The ODT for conventional memory devices are typically enabled and disabled for a memory device using an ODT control signal provided to the memory devices by a memory controller. With the ODT control signal active, the ODT for the data strobe buffers, the data buffers, and the data mask buffers are enabled to provide resistive termination, and with the ODT control signal inactive, the ODT for all of the buffers are disabled. Thus, the ODT control signal can be used by the memory controller to turn the ODT of a rank of memory on and off as needed. For example, in a memory module having a single rank of memory devices, the ODT is typically enabled for write operations, but disabled for read operations. Having control over the activation of the ODT of the rank of memory devices also allows for a preferred operating condition for writing data to a rank of memory devices in a memory system having at least two ranks of memory devices. The preferred condition is to disable the ODT for the rank of memory devices of the memory module to which data is being written and enable the ODT for the rank of memory devices of the memory module to which data is not being written. Thus, to setup this condition, the memory controller provides an active ODT control signal to the rank of memory devices not being accessed and an inactive ODT control signal to the rank of memory devices being accessed.

Another approach to improving signal timing margins is to calibrate the timing of various signals between a memory controller and the memory devices of a memory system. The signals that are received and provided by the memory controller and the memory devices of the memory module are coupled to signal lines that extend between the memory controller and the memory devices. Some signals are provided and received in parallel by each of the memory devices of the memory module and the memory controller over respective sets of parallel signals lines. These type of signals include data signals (both read and write) and strobe signals (both read and write). Each of the memory devices, at least for one rank, receives and provides data and strobe signals over its own set of signal lines that are coupled to the memory controller. In contrast, other signals are provided using a common signal line. For example, a clock signal provided by the memory controller to the memory devices of a memory module having a "fly-back" arrangement share a common clock signal line to which each of the memory devices are coupled.

In laying out the signal lines of a memory module that are coupled to the memory controller and the memory devices, it is generally the case that many of the signal lines will have different lengths. These different lengths can cause timing skews between the signals that are provided in parallel to the memory devices and the memory controller, such as data signals and strobe signals. As a result, data being written to the memory devices can arrive to each of the memory devices at slightly different times although the data is coupled to the respective signal lines by the memory controller simultaneously. Similarly, read data from each of the memory devices of a memory module can arrive at the memory controller at slightly different times although the memory devices couple the respective read data to the signal lines simultaneously.

Additionally, due to propagation delays of a signal line, a time difference at which a signal is received along the length of the signal line will result. Thus, a signal, such as a clock signal, that is provided to the memory devices of a memory module over a shared signal line will be received by each of the memory devices at slightly different times, depending on where along the length of the signal line the respective memory device is coupled.

These timing skews that are created between signals and over the length of a signal line may be only several picoseconds long. However, in high-speed memory systems, several picoseconds can significantly reduce the timing margin of signals. As the timing margin of signals decreases, subtle timing variations caused by other factors, such as variations and drifts in power, voltage, and temperature, may result in memory errors. Moreover, the timing of the signals provided to the memory devices by the memory controller can be skewed relative to one another because of the length of the signal lines and the manner in which the signal is provided to the memory devices. For example, it is desirable for write strobe signals to be aligned with the clock signal as received by each of the memory devices. However, as previously mentioned, the strobe signals are typically provided to each of the memory devices on parallel sets of signal lines, whereas the clock signal is provided to each memory device on a common signal line. In this arrangement, the relative timing of the clock signal and the write strobe signal for each of the memory devices may be different due to the propagation delay of the clock signal on the common signal line. That is, not only are the write strobe signals be skewed from the clock signal, it is possible for the amount of timing skew to be different for each of the memory devices. As a result, the timing margin for signals may be further reduced by the timing skew of the different types of signals provided to the memory devices on signal lines having different arrangements.

An approach to addressing the problems of reduced timing margin due to timing skew between signals and between the memory devices of a memory module is to calibrate the relative timing of the signals to each of the memory devices in order to compensate for the timing differences. "Pre-skewing" the timing of signals, for example, by selectively delaying the time at which the respective signals are provided by the memory controller to each of the respective memory devices, can compensate for the timing skew inherent in the memory system. Additionally, periodically performing calibration can be used to compensate for timing drift.

A specific proposal for write data strobe to clock calibration for the ranks of memory devices of a memory system has been proposed. In performing the "write levelization," a memory controller provides the clock signal and a write strobe to each of the memory devices of a rank. The memory devices are each equipped with a SR-latch having the clock signal applied to a set-input and clocked by the respective write strobe signal. The output signal of the SR-latch is provided back to the memory controller as a data signal, which is then used by the memory controller to adjust a time delay for when the write strobe is provided to the rank of memory devices. In this manner, the delay can be adjusted until the write strobe and the clock signal are aligned, as received by the respective memory devices of a rank of memory.

In practicing the write levelization process with conventional memory devices, a problem results for memory systems having more than one rank of memory devices. As previously discussed, the preferred operating condition for performing a write operation to a rank of memory devices is to disable the ODT for the rank of memory devices being accessed and enable the ODT for the rank of memory devices not being accessed. Typically, an inactive ODT control signal is provided to the rank of memory devices being accessed to disable the ODT for the data strobe, data, and data mask buffers, and an active ODT control signal is provided to the rank of memory devices not being accessed to enable the ODT for the data strobe, data, and data mask buffers. As previously discussed, the write levelization process requires, however, that a write strobe signal is provided to the memory device to clock a SR-latch, and the output of the SR-latch is provided back to the memory controller, preferably, as a data signal. To accurately simulate write operating conditions, and consequently obtain accurate write levelization, the ODT for the data strobe buffer of the rank of memory devices not being accessed should be enabled, while the ODT for the data buffer for the same rank of memory devices should be disabled to provide the SR-latch output signal back to the memory controller. This preferred condition cannot be set using conventional memory devices having ODT because although the ODT for a memory device can be enabled and disabled using the ODT control signal, the ODT for the data strobe, data, and data mask buffers are enabled and disabled together. Thus, the ODT for the data strobe buffers cannot be enabled while the ODT for the data buffers are disabled, and vice-versa.

DETAILED DESCRIPTION OF PREFERRED EMBODIMENTS

Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
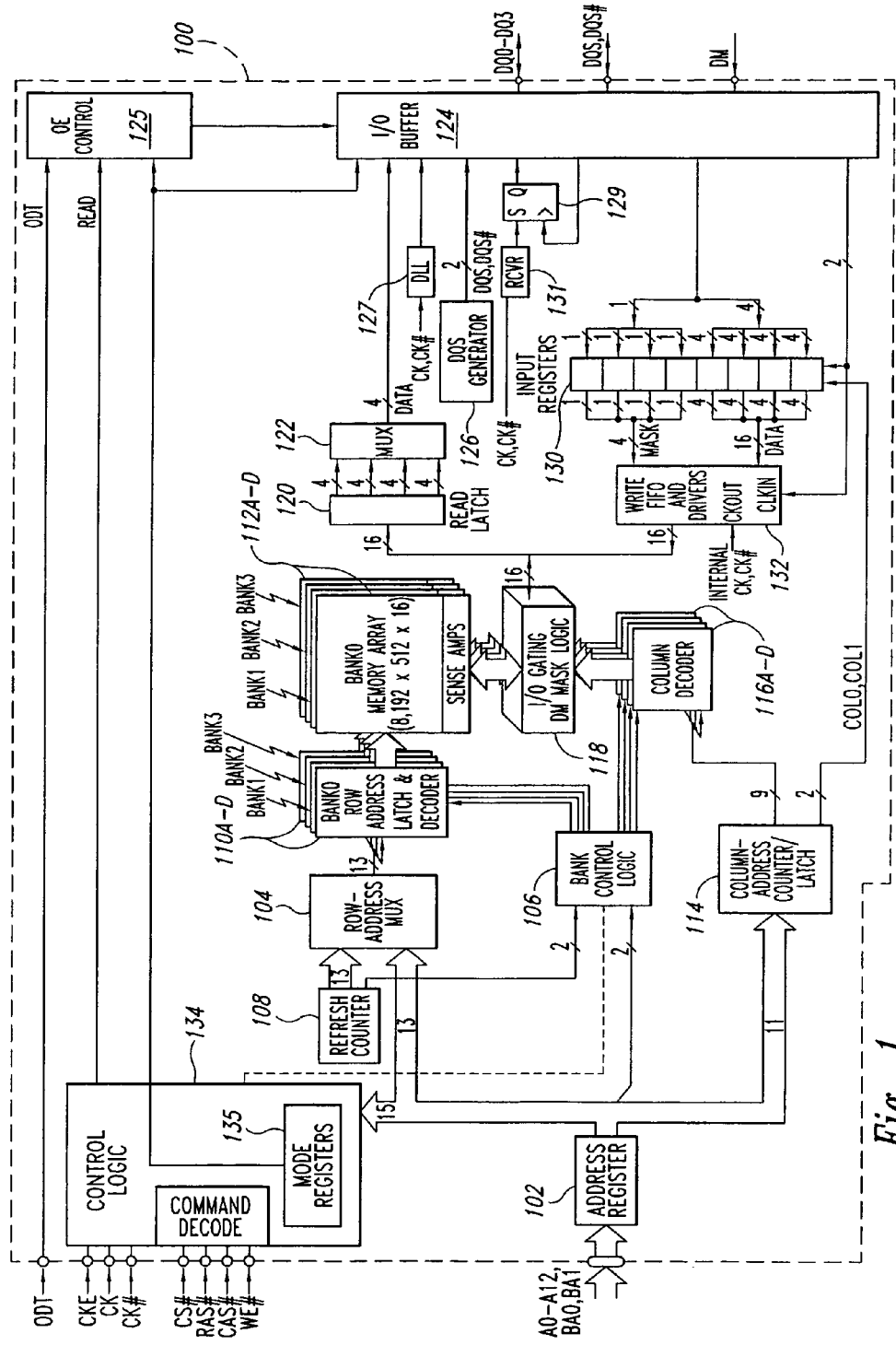
FIG. 1 is a functional block diagram of a synchronous memory device in which an embodiment of the present invention is implemented.

FIG. 1 illustrates a memory device in which an embodiment of the present invention is implemented. The memory device 100 in FIG. 1 is a double-data rate (DDR) synchronous dynamic random access memory ("SDRAM"). The memory device 100 is referred to as a double-data-rate device because the data words DQ being transferred to and from the device are transferred at double the rate of a conventional SDRAM, which transfers data at a rate corresponding to the frequency of the applied clock signal. However, the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 100 includes an address register 102 that receives row, column, and bank addresses over an address bus ADDR, with a memory controller (not shown) typically supplying the addresses. The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A-D. The bank control logic 106 activates the row address latch and decoder 110A-D corresponding to either the bank address received from the address register 102 or a refresh bank address from the refresh counter 108, and the activated row address latch and decoder latches and decodes the received row address. In response to the decoded row address, the activated row address latch and decoder 110A-D applies various signals to a corresponding memory bank 112A-D to thereby activate a row of memory cells corresponding to the decoded row address. Each memory bank 112A-D includes a memory-cell array having a plurality of memory cells arranged in rows and columns, and the data stored in the memory cells in the activated row is stored in sense amplifiers in the corresponding memory bank. The row address multiplexer 104 applies the refresh row address from the refresh counter 108 to the decoders 110A-D and the bank control logic circuit 106 uses the refresh bank address from the refresh counter when the memory device 100 operates in an auto-refresh or self-refresh mode of operation in response to an auto-or self-refresh command being applied to the memory device 100, as will be appreciated by those skilled in the art.

A column address is applied on the ADDR bus after the row and bank addresses, and the address register 102 applies the column address to a column address counter and latch 114 which, in turn, latches the column address and applies the latched column address to a plurality of column decoders 116A-D. The bank control logic 106 activates the column decoder 116A-D corresponding to the received bank address, and the activated column decoder decodes the applied column address. Depending on the operating mode of the memory device 100, the column address counter and latch 114 either directly applies the latched column address to the decoders 116A-D, or applies a sequence of column addresses to the decoders starting at the column address provided by the address register 102. In response to the column address from the counter and latch 114, the activated column decoder 116A-D applies decode and control signals to an I/O gating and data masking circuit 118 which, in turn, accesses memory cells corresponding to the decoded column address in the activated row of memory cells in the memory bank 112A-D being accessed.

Figure 3:
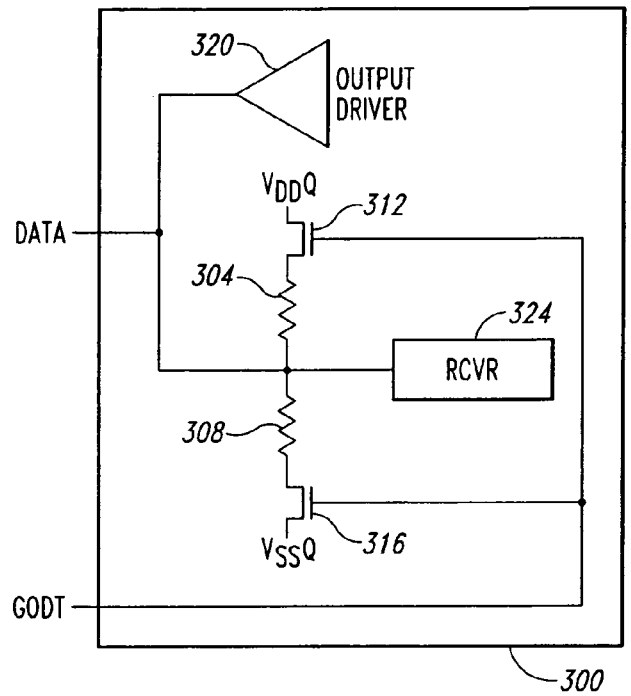
FIG. 3 is a functional diagram of an on-die termination circuit of the input/output buffer of FIG. 2.

During data read operations, data being read from the addressed memory cells are coupled through the I/O gating and data masking circuit 118 to a read latch 120. The I/O gating and data masking circuit 118 supplies N bits of data to the read latch 120, which then applies four N/4 bit words to a multiplexer 122. In the embodiment of FIG. 3, the circuit 118 provides 8 bits to the read latch 120 which, in turn, provides four 4 bits words to the multiplexer 122. An I/O buffer 124 sequentially receives the N/4 bit words from the multiplexer 122 and also receives a data strobe signal DQS from a strobe signal generator 126 and a delayed clock signal CLKDEL from the delay-locked loop (DLL) 127. The I/O buffer 124 includes output buffer circuits (not shown) that have output circuits to generate output signals from the memory device 100 and input buffer circuits (not shown) to receive input signals to the memory device 100. The buffer circuits further include on-die termination (ODT) circuitry (not shown) to provide resistive termination for the buffer circuits. An output enable (OE) control 125 is used to configure the I/O buffer 124 in accordance with various signals, such as flag bits of a mode register 135, an external ODT control signal, and internal control signals. In response, the OE control 125 generates signals that set the I/O buffer 124 in different configurations, for example, enabling and disabling the ODT circuitry for the output buffers and input buffers of the I/O buffer 124. As will be explained in more detail below, the mode register 135 can be used for storing flag bits that are used to set various modes of operation of the memory device 100.

The DQS signal is used by an external circuit such as a memory controller (not shown) for synchronizing receipt of read data during read operations. In response to the delayed clock signal CLKDEL, the I/O buffer 124 sequentially outputs the received N/4 bits words as a corresponding data word DQ, each data word being output in synchronism with rising and falling edges of a CLK signal that is applied to clock the memory device 100. The I/O buffer 124 also outputs the data strobe signal DQS having rising and falling edges in synchronism with rising and falling edges of the CLK signal, respectively. Each data word DQ and the data strobe signal DQS collectively define a data bus DATA. The DATA bus also includes masking signals DM0-M, which will be described in more detail below with reference to data write operations.

During data write operations, an external circuit such as a memory controller (not shown) applies N/4 bit data words DQ, the strobe signal DQS, and corresponding data masking signals DM on the data bus DATA. The I/O buffer 124 receives each DQ word and the associated DM signals, and applies these signals to input registers 130 that are clocked by the DQS signal. In response to a rising edge of the DQS signal, the input registers 130 latch a first N/4 bit DQ word and the associated DM signals, and in response to a falling edge of the DQS signal the input registers latch the second N/4 bit DQ word and associated DM signals. The input register 130 provides the four latched N/4 bit DQ words as an N-bit word to a write FIFO and driver 132, which clocks the applied DQ word and DM signals into the write FIFO and driver in response to the DQS signal. The DQ word is clocked out of the write FIFO and driver 132 in response to the CLK signal, and is applied to the I/O gating and masking circuit 118. The I/O gating and masking circuit 118 transfers the DQ word to the addressed memory cells in the accessed bank 112A-D subject to the DM signals, which may be used to selectively mask bits or groups of bits in the DQ words (i.e., in the write data) being written to the addressed memory cells.

A SR-latch 129 is also coupled to the I/O buffer 124 to provide write strobe signal to clock signal calibration capability if desired. As previously discussed, when the calibration, or write levelization, is performed, a write strobe signal received by the I/O buffer 124 is used to clock the SR-latch 129, and a clock signal, represented by the output of a clock receiver 131, is coupled to the set-input. The output signal of the SR-latch 129 is coupled to the I/O buffer 124 for provision to a memory controller as a data signal.

A control logic and command decoder 134 receives a plurality of command and clocking signals over a control bus CONT, typically from an external circuit such as a memory controller (not shown). The command decoder 134 includes the mode register 135. The command signals include a chip select signal CS#, a write enable signal WE#, a column address strobe signal CAS#, and a row address strobe signal RAS#, while the clocking signals include a clock enable signal CKE# and complementary clock signals CLK, CLK#, with the "#" designating a signal as being active low. The command signals CS#, WE#, CAS#, and RAS# are driven to values corresponding to a particular command, such as a read, write, or auto-refresh command.

In response to the clock signals CLK, CLK#, the command decoder 134 latches and decodes an applied command, and generates a sequence of clocking and control signals that control the components 102-132 to execute the function of the applied command. One example of the control signals, as shown in FIG. 1, is a READ signal having a logic level indicative of whether a read command has been received which is generated by the command decoder 134. The clock enable signal CKE enables clocking of the command decoder 134 by the clock signals CLK, CLK#. The command decoder 134 latches command and address signals at positive edges of the CLK, CLK# signals (i.e., the crossing point of CLK going high and CLK# going low), while the input registers 130 and data drivers 124 transfer data into and from, respectively, the memory device 100 in response to both edges of the data strobe signal DQS and thus at double the frequency of the clock signals CLK, CLK#. This is true because the DQS signal has the same frequency as the CLK, CLK# signals. The detailed operation of the control logic and command decoder 134 in generating the control and timing signals is conventional, and thus, for the sake of brevity, will not be described in more detail.

Figure 2:
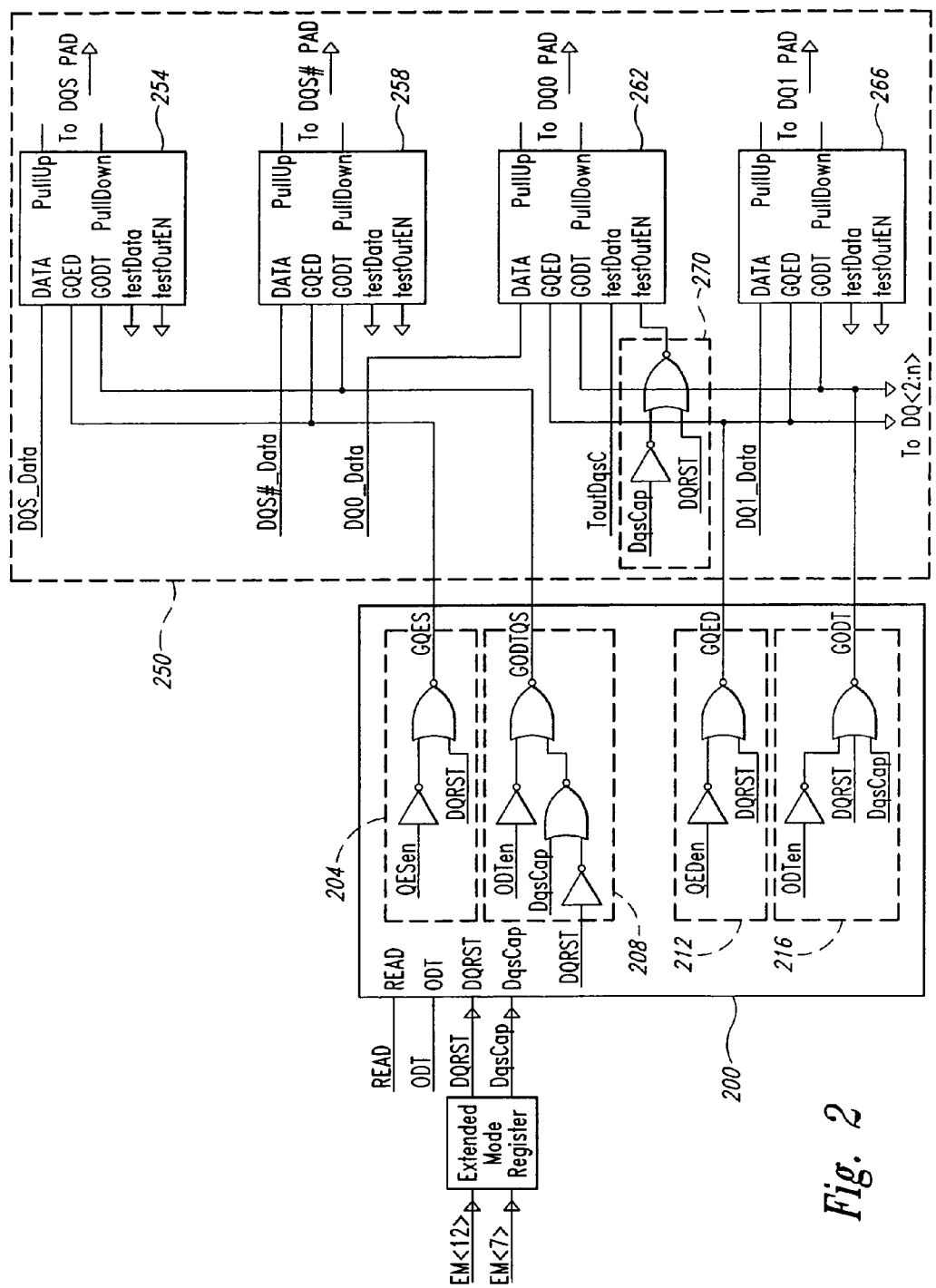
FIG. 2 is a schematic block diagram of an output enable control circuit and an input/output buffer according to an embodiment of the present invention.

FIG. 2 illustrates a portion of an OE control logic 200 and an output buffer 250 according to embodiments of the present invention. The OE control logic 200 can be substituted for the OE control logic 125 and the output buffer 250 can be included in the I/O buffer 124 of FIG. 1. As will be explained in more detail below, the OE logic control 200 and the output buffer 250 provide for the ODT of different sets of buffer circuits of the output buffer 250 to be enabled or disabled independently. The OE control logic 200 receives a READ signal having a logic state indicative of whether a read operation is being executed and further receives an ODT signal having a logic state indicative of whether the ODT of the output buffer 250 should be enabled. The OE control logic 200 is also coupled to the mode register 135. As previously discussed, the mode register 135 stores flag bits that allow the memory device 100 to be set various modes of operation. Two flag bits of the mode register 135 set modes of operation related to the OE control logic 200, namely, an output enable flag bit which can be set to enable or disable output operation of the output buffer 250, and an ODT mode flag bit which can be set to allow for the ODT of different sets of buffers of the output buffer 250 to be enabled or disabled independently. As shown in FIG. 2, the output enable flag bit is bit EM<12> and the ODT mode flag bit is bit EM<7> of the mode register 135. It will be appreciated by those ordinarily skilled in the art that the specific bit used as the output enable and ODT mode flag bits can be changed without departing from the scope of the present invention. The OE control logic 200 further includes data strobe buffer control logic 204, data strobe ODT control logic 208, data buffer control logic 212, and data buffer ODT control logic 216. The control logic 204, 208, 212, 216 provide control signals GQES, GODTQS, GQED, and GODT, respectively.

The output buffer 250 is shown in FIG. 2 as including data strobe buffer circuits 254, 258, and data buffer circuits 262, 266. Although not shown in detail, the buffer circuits 254, 258, 262, 266 include output circuits to generate output signals from the memory device 100 and input circuits to receive input signals to the memory device 100. The output circuits are enabled for read operations and the input circuits are enabled for write operations. Conventional output and input circuits known in the art, or later developed, can be used in the buffer circuits 254, 258, 262, 266. The buffer circuits 254, 258, 262, 266 are configured to operate in a test mode when an active testOutEN signal is received. In the test mode, the respective buffer circuits 254, 258, 262, 266 will couple the signal applied to a test-data input to the output. The data strobe buffer and data buffer circuits 254, 258, 262, 266 further include ODT capability to provide resistive terminations.

FIG. 3 illustrates a functional drawing of a buffer circuit 300 according to an embodiment of the present invention that includes ODT capability. The buffer circuit 300 includes ODT impedance devices, shown in FIG. 3 as resistors 304, 308, that are coupled in series with ODT switches 312, 316 between a voltage supply having a data high voltage level VddQ and a voltage supply having a data low voltage level VssQ. The ODT switches 312, 316 are controlled by a GODT signal and couple the ODT resistors 304, 308 across the VddQ and VssQ voltage levels to provide resistive termination for the buffer circuit 300. As shown in FIG. 3, the ODT is available for both read data, provided by the output driver 320, and for write data, received by the receiver 324. It will be appreciated by those ordinarily skilled in the art, however, that alternative arrangements for the ODT can be utilized as well without departing from the scope of the present invention. For example, the ODT can use impedance devices such as transistors to replace or supplement the resistors shown in FIG. 3.

With reference to FIG. 2, the data strobe buffer circuits 254 and 258 are the buffer circuits for the data strobe signal DQS and the complementary data strobe signal DQS#, respectively, and are coupled to the data strobe buffer control logic 204 and the data strobe ODT control logic 208. The data strobe buffer circuits 254, 258 are further coupled to the DQS generator 126 (FIG. 1) to receive the DQS and DQS# signals. The data buffer circuits 262 and 266 are the buffer circuits for data signals DQ0 and DQ1. Additional data buffer circuits, not shown in FIG. 2, can be included in the output buffer 250, with the total number of data buffer circuits corresponding to the data width of the memory device 100. The data buffer circuits 262, 266 are coupled to the data buffer control logic 212 and the data buffer ODT control logic 216, and are further coupled to the multiplexer 122 (FIG. 1) to receive read data retrieved from the memory arrays 112A-D. In the embodiment shown in FIG. 2, the output buffer 250 further includes write strobe synchronization logic 270 coupled to the data buffer circuit 262, which corresponds to the data buffer circuit for DQ0. In alternative embodiments, the write strobe synchronization logic 270 can be coupled to a different data buffer circuit included in the output buffer 250, and thus, the scope of the present invention is not limited to having the data buffer circuit for DQ0 coupled to the strobe synchronization logic 270. As will be explained in more detail below, the write strobe synchronization logic 270 can be included in the output buffer 250 where write levelization between a memory controller and the memory device 100 is desirable.

The ODT of the buffer circuits 254, 258, 262, and 266 can be enabled or disabled under the control of the ODT signal, which is typical during normal operation of the memory device 100. Under normal operation, the output enable flag bit EM<12> is set LOW to enable output operation of the data strobe and data buffer circuits 254, 258, 262, and 266, and the ODT mode flag bit EM<7> is set LOW to disable the independent operation of the ODT of the data buffer circuits 262, 266. The LOW EM<12> bit results in a LOW DQRST signal and the LOW EM<7> bit results in a LOW DqsCap signal. With the DQRST signal LOW, the data strobe buffer control logic 204 behaves as a signal buffer for a QESen signal, which is provided to the data strobe buffer circuits 254, 258 as a GQES signal. Similarly, the data buffer control logic 212 behaves as a signal buffer for a QEDen signal, which is provided to the data buffer circuits 262, 266 as a GQED signal. The QESen and QEDen signals have logic levels corresponding to the READ signal, and the GQES and GQED signals represent data strobe buffer enable and data buffer enable signals, respectively. Consequently, the GQES and GQED signals have active HIGH logic levels when the READ signal provided by the control logic 134 (FIG. 1) is active, indicating that a read operation has been requested. The GQES and GQED signals in turn activate the output circuits of the respective buffer circuits to output the signal received at the data terminals. That is, the data strobe buffer circuit 254 drives the DQS signal, the data strobe buffer circuit 258 drives the DQS# signal, the data buffer circuit 262 drives the DQ0 signal and the data buffer circuit 266 drives the DQ1 signal.

The data strobe ODT control logic 208 and the data ODT control logic 216, with LOW DQRST and DqsCap signals, also behave as signal buffers, with the ODT control logic 208 and the data ODT control logic 216 providing an ODTen signal to the data strobe buffer circuits 254, 258 as a GODTQS signal and to the data buffer circuits 262, 266 as a GODT signal, respectively. The logic level of the ODTen signal, and consequently, the GODTQS and GODT signals, correspond to the logic level of the ODT signal applied to the memory device 100 when the state of operation of the memory device 100 (i.e., read or write operation) is a write state. Thus, the ODTen signal enables and disables the ODT of the buffer circuits 254, 258, 262, and 266 in accordance with the ODT signal during a write operation. As a result, the ODT signal will control activation of the ODT for the data strobe and data buffer circuits 254, 258, 262, and 266.

Additionally, the ODT of the data buffer circuits 262, 266 can be disabled independently of the ODT for the data strobe buffer circuits 254, 258. As a result, the ODT for the data strobe buffer circuits 254, 258 can be enabled and disabled using the ODT signal without affecting the state of the ODT for the data buffer circuits 262, 266. When independent control of the ODT for the data strobe buffers circuits 254, 258 and the data buffer circuits 262, 266 is desired, the output enable flag bit EM<12> can remain LOW, but the ODT mode flag bit EM<7> is set HIGH. In this state, the DQRST signal still has a LOW logic state, but the DqsCap signal now has a HIGH logic state. The data strobe buffer control logic 204 and the data buffer control logic 212 operate as previous described, buffering the QESen signal and the QEDen signal, respectively, and provide active GQES and GQED signals when a read operation is requested to activate output circuits of the data strobe and data buffer circuits 254, 258 and 262, 266. Similarly, although the DqsCap signal is HIGH, the data strobe ODT control logic 208 still operates as a signal buffer for the ODTen signal, providing the GODTQS signal to enable and disable the ODT of the data strobe buffer circuits 254, 258. However, the HIGH DqsCap signal causes the GODT signal output by the data ODT control logic 216 to have a LOW logic level, regardless of the logic level of the ODTen signal. Consequently, the ODT for the data buffer circuits 262, 266 are disabled, regardless of the logic level of the ODT signal provided to the memory 100. As a result, activation of the ODT for the data strobe buffer circuits 254, 258 through the use of the ODT signal is now independent from the activation of the ODT for the data buffer circuits 262, 266.

In the event the output enable flag bit EM<12> is set HIGH to disable output operation of the buffer circuits 254, 258, 262, 266, the GQES signal provided by the data strobe buffer control logic 204, the GQED signal provided by the data buffer control logic 212, and the GODT signal provided by the data ODT control logic 216 will be LOW, disabling the output circuits of the buffer circuits 254, 258, 262, 266 and disabling the ODT of the data buffer circuits 262, 266. The EM<12> bit is typically used during characterization of operating currents for the memory device 100. In contrast to the GODT signal from the ODT control logic 216, the GODTQS signal provided by the data strobe ODT control logic 208 will have a logic state depending on the state of the ODT mode flag bit EM<7> and the state of the ODT signal. Typically, however, when the EM<12> bit is set HIGH, the EM<7> bit will be set LOW to have normal operation of the ODT for the buffer circuits 254, 258, 262, 266. As a result, the GODTQS signal has a LOW logic level, regardless of the logic level of the ODTen signal, to disable the ODT of the data strobe buffer circuits 254, 258.

The independent operation of the ODT for the data strobe buffer circuits 254, 258 and for the data buffer circuits 262, 266 can be utilized in many ways. One such way is for performing write levelization between a memory controller and the memory devices of a memory module. As previously discussed, the process of write levelization is used to deskew a clock signal and a write strobe signal provided to a memory device so that the write strobe is aligned with the clock edges of the clock signal. The skewing of signals, as also previously discussed, can result from the manner in which the respective signals are coupled between the memory controller and the respective memory devices, as well as from inherent line impedances and other propagation delays.

Currently, write levelization is performed by providing a clock signal and a write strobe signal to one rank of memory devices of a memory system. As previously discussed, a rank of memory devices generally refers to a group of memory devices that are accessed concurrently. Each of the memory devices of the rank includes a SR-latch that is clocked by the write strobe signal and has the clock signal as the set-input for the latch. The output signals of each of the latches are output by the respective memory devices and fed back to the memory controller. Typically, data terminal DQ0 is used to output the signal fed back to the memory controller. With reference to FIG. 2, the write strobe synchronization logic 270 is included with the output buffer 250 to enable and disable a test-data input for the data buffer circuit 262. As shown in FIG. 2, the write strobe synchronization logic 270 controls whether the test-data input is enabled so that a test-date signal ToutDqsC coupled to the test-data input of the data buffer circuit 262 is output instead of a signal applied to the data input of the data buffer circuit 262.

Figure 4:
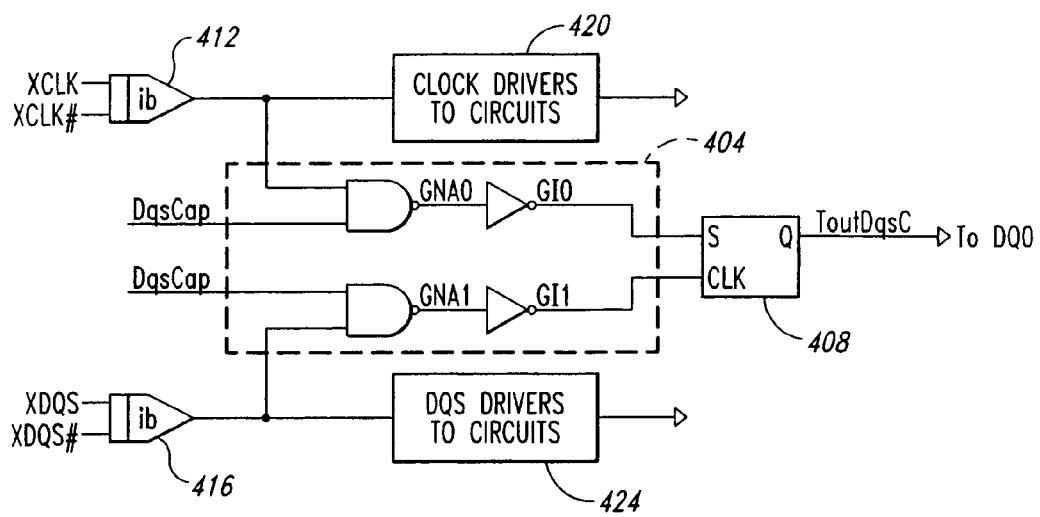
FIG. 4 is a schematic block diagram of a SR-latch and control logic that can be used with embodiments of the present invention for write levelization.

An example of a SR-latch and control logic is illustrated in FIG. 4. External clock and data strobe signals XCLK, XCLK# and DQS, DQS# are coupled to internal buffers 412 and 416, respectively. The buffered clock and data strobe signals are coupled to respective signal drivers 420, 424, which provide the clock and data strobe signals to circuitry in the memory device 100. The buffered clock signal and data strobe signal are coupled to control logic 404. A DqsCap signal, which has a logic level set by flag bit EM<7> (FIG. 2), controls coupling of the clock and data strobe signals output by the internal signal buffers 412, 416 to the set-input and clock input, all respectively, of a SR-latch 408. The output signal ToutDqsC of the SR-latch 408 is coupled to the test-data input of the data buffer circuit 262 to be output by the memory device 100 as DQ0. FIG. 4 illustrates a particular example of control logic and a SR-latch for the purpose of write levelization. However, it will be appreciated by those ordinarily skilled in the art that alternative designs can be used as well.

As previously discussed, the output signals of the memory devices are used to adjust a respective time delay at the memory controller by which the write strobe signals output by the memory controller and provided to a respective memory device are delayed. The time delay for each of write strobe signals is adjusted until the respective write strobe signal is aligned with the clock signal, as received by the respective memory devices of a rank of memory on a memory module. Multiple ranks of memory can be on a memory module, but it is typical for have one or two ranks of memory devices per module. Additionally, a memory system can have a plurality of ranks of memory devices, with the ranks arranged in single rank modules and dual rank modules.

As will be illustrated by the following examples, the independent ODT control provided by embodiments of the present invention allow for the preferable write levelization conditions to be set for both a single rank memory module and a dual rank memory module.

Figure 5:
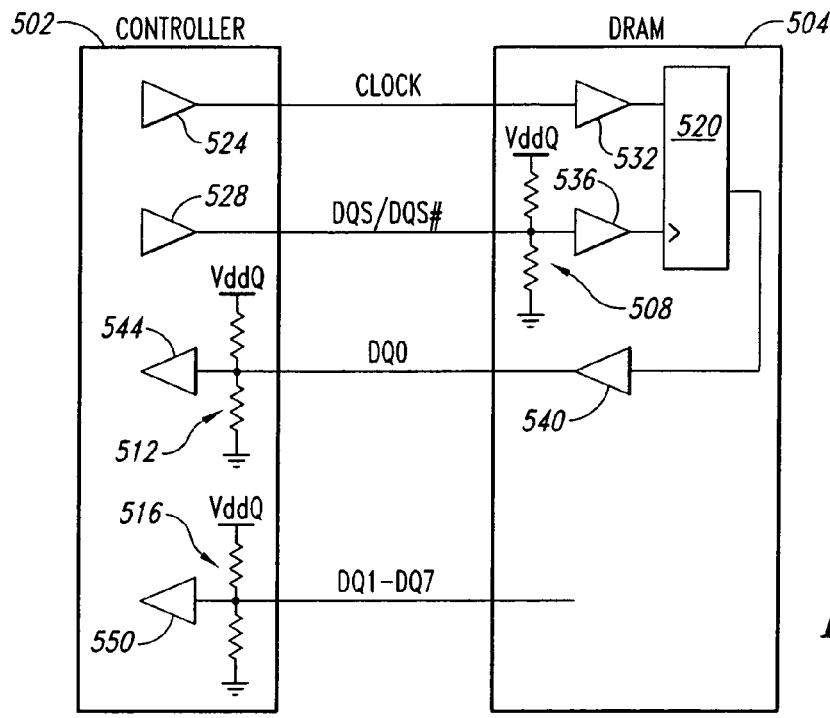
FIG. 5 is a functional diagram of a memory controller and a memory device of a single rank memory system on which write levelization is performed.

When performing write levelization for the memory devices of a memory system having only one rank of memory devices, the ODTs for the data strobe terminals, DQS and DQS#, of the memory devices are active, while the ODTs for the data terminals, DQ0-DQn, are preferably inactive. Any resistive terminations at the data terminals of the memory controller are enabled. These conditions for write levelization of a single rank memory system are shown in FIG. 5. A memory controller 502 is coupled to a memory device 504, which represents a memory device of the single rank of memory. Output buffers 524, 528 drive a clock signal and a write strobe signal that are coupled to the input buffers 532 and 536 of memory device 504, all respectively. An ODT 508 is activated for the input buffer 536 to provide a resistive termination for the write strobe signal. A SR-latch 520 in the memory device 504 is clocked by the write strobe signal and receives the clock signal as the set-input signal. The output of the SR-latch 520 is provided to an output buffer 540, representing the output buffer for the data terminal DQ0. The output signal from DQ0 is coupled back to an input buffer 544 of the memory controller 502. An ODT 512 is activated for the memory controller to provide a resistive termination for the output signal from DQ0. Although not shown in FIG. 5, the output signal from DQ0 is used to adjust the timing of the write strobe signal output by the memory controller 502 relative to the clock signal. In this manner, the write strobe signal can be pre-skewed so that the write strobe signal and the clock signal are aligned when received by the memory device 504.

To set the conditions for write levelization of a rank of memory devices for a memory system having only one rank of memory devices, with reference to FIG. 2, the flag bit EM<7> is set HIGH and the flag bit EM<12> is set LOW to enable independent ODT control and enable the output circuits of the buffer circuits 254, 258, 262, 266. The ODT signal applied to the memory device 100 is HIGH and a write command is issued. Under these conditions the data strobe buffer circuits 254, 258 have the ODT enabled and the input circuits are enabled to receive the write strobe signal, either or both the DQS and DQS# signals, as previously described. Additionally, the ODTs for the data buffer circuits 262, 266 are disabled and the write strobe synchronization logic 270 enables the data buffer circuit 262 to output the ToutDqsC signal applied to the test-data input. With reference to FIG. 4, the DqsCap signal set HIGH by the flag bit EM<7> couples the clock signal and the write strobe signal to the set-input and the clock input of the SR-latch, respectively. The ToutDqsC signal is output from the SR-latch 420 (FIG. 5), which is buffered by the data buffer circuit 262 and coupled back to the memory controller 402 as the DQ0 signal.

Figure 6:
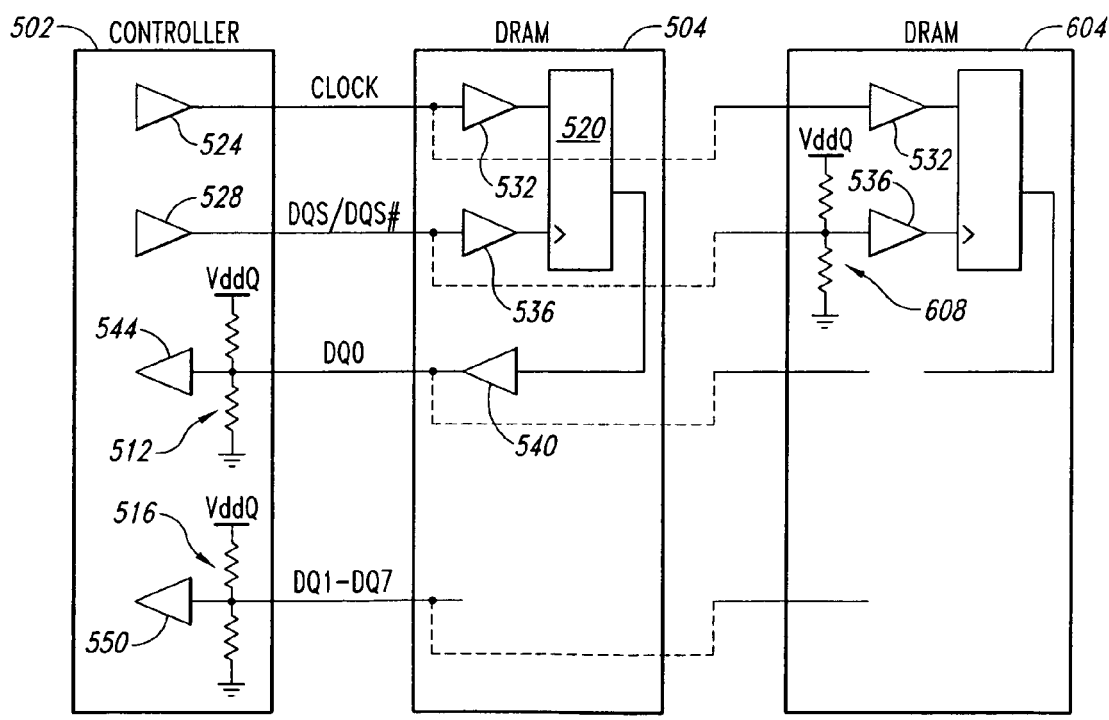
FIG. 6 is a functional diagram of a memory controller and two memory devices, each representing a different rank of memory devices, where write levelization is performed on one of the ranks of memory devices.

Write levelization for a rank of memory devices in a memory system having two or more ranks of memory devices is performed under different conditions than previously described for a memory system having only one rank of memory devices. With two or more ranks of memory devices, the preferred condition is to disable the ODT for the rank of memory devices for which write levelization is performed, while setting only the ODT for the data strobe terminals DQS and DQS# of the other ranks of memory devices on which write levelization is not performed. The resistive terminations at the data terminals of the memory controller are enabled, the same as with the write levelization conditions for a single rank memory system. FIG. 6 illustrates the preferred write levelization conditions for a memory system having two or more ranks of memory devices. Where appropriate, the same reference numbers used in FIG. 5 have also been used in FIG. 6. A memory device 604, representing a memory device of a second rank of memory devices, has an ODT 608 enabled for the data strobe terminal, shown as input buffer 536. Although the write levelization is being performed on the first rank of memory devices, represented by the memory device 504, and not being performed on the second rank of memory devices, the ODT 608 of the memory device 604 is enabled.

To set the preferred condition for write levelization of a rank of memory devices in a memory system having two or more ranks of memory devices, the memory device 504 has the flag bit EM<7> set HIGH to enable the test mode of the data buffer circuit 262 (through the write strobe synchronization logic 270 (FIG. 2)) and couple the clock signal and the write strobe signal to the SR-latch (FIG. 4). Additionally, the flag bit EM<12> set LOW to enable the output circuits of the buffer circuits 254, 258, 262, 266. However, in contrast to the conditions for write levelization for a rank of memory devices in a single rank memory system, as previously discussed, the ODT signal applied to the memory device 504 is LOW, disabling all of the ODTs for the data strobe and data buffer circuits of the memory device 504. As for the memory device 604, the flag bit EM<7> set HIGH to enable independent ODT control for the data strobe buffer circuits, and the flag bit EM<12> is set HIGH to disable the output circuitry of the buffer circuits 254, 258, 262, 266 of the memory device 604. The ODT signal coupled to the memory device 604 is HIGH in order to enable the ODT for the data strobe buffer circuits 254, 258.

Figure 7:
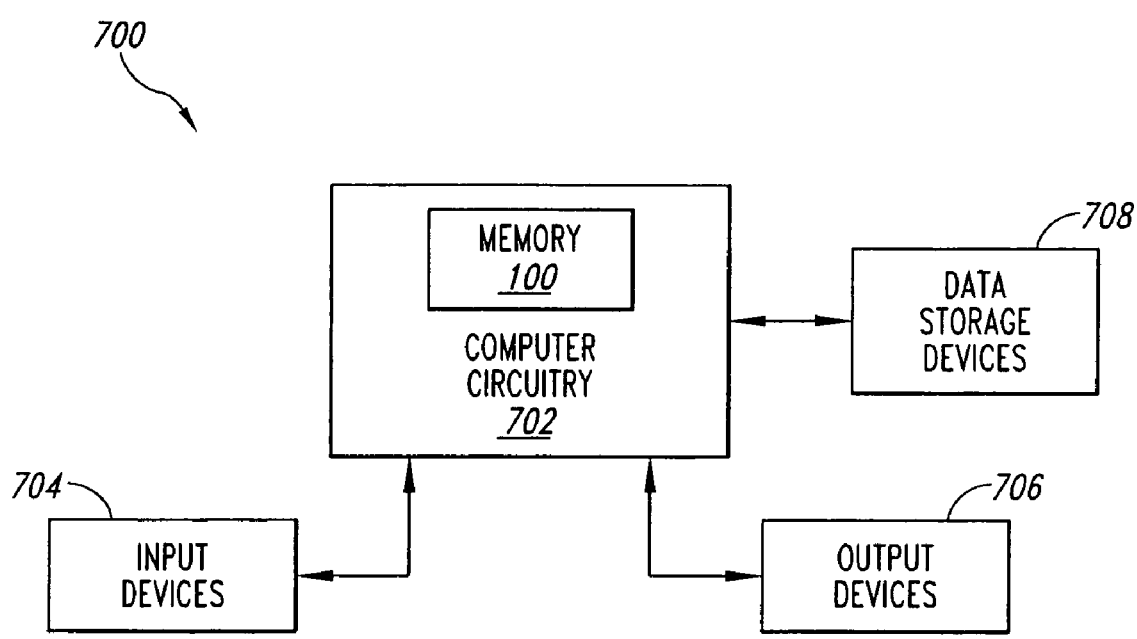
FIG. 7 is a functional block diagram illustrating a computer system including a synchronous memory device in which an embodiment of the present invention is included.

FIG. 7 is a block diagram of a computer system 700 including computer circuitry 702 including the memory device 100 of FIG. 1. Typically, the computer circuitry 702 is coupled through address, data, and control buses to the memory device 100 to provide for writing data to and reading data from the memory device. The computer circuitry 702 includes circuitry for performing various computing functions, such as executing specific software to perform specific calculations or tasks. In addition, the computer system 700 includes one or more input devices 704, such as a keyboard or a mouse, coupled to the computer circuitry 702 to allow an operator to interface with the computer system. Typically, the computer system 700 also includes one or more output devices 706 coupled to the computer circuitry 702, such as output devices typically including a printer and a video terminal. One or more data storage devices 708 are also typically coupled to the computer circuitry 702 to store data or retrieve data from external storage media (not shown). Examples of typical storage devices 708 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An output buffer, comprising:
   a plurality of buffer circuits, each buffer circuit having an input circuit and an output circuit, and further having a termination circuit coupled to the input and output circuits, the termination circuit having an activation node to which an activation signal is coupled to enable and disable the termination circuit; and
   a control circuit coupled to the plurality of buffer circuits and having a mode select node to which a mode select signal is applied and a control node to which a control signal is applied, in response to a first state of the mode select signal and an active control signal, the control circuit configured to generate an active activation signal for the plurality of buffer circuits, and in response to a second state of the mode select signal and an active control signal, the control circuit further configured to generate an active activation signal for a first subset of the plurality of buffer circuits and an inactive activation signal for a second subset of the plurality of buffers circuit.

2. The output buffer of claim 1 wherein the control circuit comprises:
   a first logic circuit having input nodes at which the mode select signal and the control signal are applied and further having an output node coupled to the activation nodes of the first subset of the plurality of buffer circuits, the first logic circuit configured to generate an active activation signal for the first subset of the plurality of buffer circuits in response to the second state of the mode select signal and an active control signal; and
   a second logic circuit having input nodes at which the mode select signal and the control signal are applied and further having an output node coupled to the activation nodes of the second subset of the plurality of buffer circuits, the second logic circuit configured to generate an inactive activation signal for the second subset of the plurality of buffer circuits in response to the second state of the mode select signal and an active control signal.

3. The output buffer of claim 1 wherein the second subset of the plurality of buffer circuits comprises at least one buffer circuit having a test circuit having a test control node at which a test control signal is applied and further having a test input node to which a test input signal is applied, the test circuit configured to couple the test input node to the output circuit in response to the test control signal.

4. The output buffer of claim 3, further comprising a test logic circuit having an input node at which the mode select signal is applied and an output coupled to the test control node of the buffer circuit having the test circuit to enable the test circuit in response to the second state of the mode select signal.

5. The output buffer of claim 1 wherein the first subset of the plurality of buffer circuits comprises a set of buffer circuits coupled to receive data strobe signals and the second subset of the plurality of buffer circuits comprises a set of buffer circuits coupled to receive data signals.

6. The output buffer of claim 1, further comprising a buffer control circuit coupled to the plurality of buffer circuits, the buffer control circuit having a first logic circuit configured to enable the output circuits of the first subset of the plurality of buffer circuits responsive to an output enable control signal and further having a second logic circuit configured to enable the output circuits of the second subset of the plurality of buffer circuits responsive to the output enable control signal.

7. The output buffer of claim 1 wherein the termination circuit comprises:
   a pair of series coupled impedance devices;
   a first switch coupled to a first of the pair of series coupled impedance devices and a first voltage and having a control node coupled to the activation node; and
   a second switch coupled to a second of the pair of series coupled impedance devices and a second voltage and having a control node coupled to the activation node, the first and second switches selectively coupling the pair of series coupled impedance devices between the first voltage and the second voltage responsive to the activation signal.

8. An output buffer, comprising:
   at least one data strobe buffer circuit having an data strobe node at which a read strobe signal is provided and a write strobe signal is received;
   a plurality of data buffer circuits, each having a data output node at which a read data signal is provided and a write data signal is received;
   at least one resistive termination circuit having resistive terminations coupled to the data strobe node of the at least one data strobe buffer circuit, further having a strobe termination activation node at which a first control signal is applied and configured to enable the resistive terminations coupled to the data strobe node responsive to the first control signal; and
   a plurality of resistive termination circuits having resistive terminations, each of the plurality of resistive termination circuits coupled to each of the plurality of data buffer circuits, respectively, each further having an I/O termination activation node at which a second control signal is applied and configured to enable the resistive terminations coupled to the data output nodes of each data buffer circuit responsive to the second control signal.

9. The output buffer of claim 8, further comprising a control circuit having
   a first logic circuit having input nodes at which the a termination mode select signal and a termination control signal are applied and further having an output node coupled to the strobe termination activation node, the first logic circuit configured to generate an active first control signal in response to a first or second state of the termination mode select signal and an active termination control signal; and
   a second logic circuit having input nodes at which the termination mode select signal and the termination control signal are applied and further having an output node coupled to the output termination activation node, the second logic circuit configured to generate an active second control signal in response to the first state of the termination mode select signal and the active termination control signal and generate an inactive second control signal in response to the second state of the termination mode select signal and the active termination control signal.

10. The output buffer of claim 9 wherein the plurality of data buffer circuits comprises at least one data buffer circuit including a test circuit having a test control node at which a test control signal is applied and further having a test input node to which a test input signal is applied, the test circuit configured to couple the test input node to the data output node in response to the test control signal.

11. The output buffer of claim 10, further comprising test logic circuit having an input node at which the termination mode select signal is applied and an output coupled to the test control node of the buffer circuit having the test circuit to enable the test circuit in response to the second state of the termination mode select signal.

12. The output buffer of claim 8 wherein the resistive terminations of the resistive termination circuits comprise:
   a pair of series coupled resistors;
   a first switch coupled to a first of the pair of series coupled resistors and a first voltage and having a control node coupled to at least one of the strobe and output termination activation nodes; and
   a second switch coupled to a second of the pair of series coupled resistors and a second voltage and having a control node coupled to at least one of the strobe and output termination activation nodes, the first and second switches selectively coupling the pair of series coupled resistors between the first and second voltages.

13. A memory device, comprising:
   an address bus;
   a control bus;
   a data bus;
   an address decoder coupled to the address bus;
   a read/write circuit coupled to the data bus;
   a control circuit coupled to the control bus;
   a memory-cell array coupled to the address decoder, control circuit, and read/write circuit; and
   an output buffer coupled to the data bus and the control circuit, the output buffer comprising:
   a plurality of buffer circuits, each buffer circuit having an input circuit and an output circuit, and further having a termination circuit coupled to the input and output circuits, the termination circuit having an activation node to which an activation signal is coupled to enable and disable the termination circuit; and
   a termination control circuit coupled to the plurality of buffer circuits and having a mode select node to which a mode select signal is applied and a control node to which a control signal is applied, in response to a first state of the mode select signal and an active control signal, the termination control circuit configured to generate an active activation signal for the plurality of buffer circuits, and in response to a second state of the mode select signal and an active control signal, the termination control circuit further configured to generate an active activation signal for a first subset of the plurality of buffer circuits and an inactive activation signal for a second subset of the plurality of buffers circuit.

14. The memory device of claim 13 wherein the termination control circuit of the output buffer comprises:
   a first logic circuit having input nodes at which the mode select signal and the control signal are applied and further having an output node coupled to the activation nodes of the first subset of the plurality of buffer circuits, the first logic circuit configured to generate an active activation signal for the first subset of the plurality of buffer circuits in response to the second state of the mode select signal and an active control signal; and
   a second logic circuit having input nodes at which the mode select signal and the control signal are applied and further having an output node coupled to the activation nodes of the second subset of the plurality of buffer circuits, the second logic circuit configured to generate an inactive activation signal for the second subset of the plurality of buffer circuits in response to the second state of the mode select signal and an active control signal.

15. The memory device of claim 13 wherein the second subset of the plurality of buffer circuits of the output buffer comprises at least one buffer circuit having a test circuit having a test control node at which a test control signal is applied and further having a test input node to which a test input signal is applied, the test circuit configured to couple the test input node to the output circuit in response to the test control signal.

16. The memory device of claim 15, further comprising a test logic circuit having an input node at which the mode select signal is applied and an output coupled to the test control node of the buffer circuit having the test circuit to enable the test circuit in response to the second state of the mode select signal.

17. The memory device of claim 13 wherein the first subset of the plurality of buffer circuits of the output buffer comprises a set of buffer circuits coupled to receive data strobe signals and the second subset of the plurality of buffer circuits comprises a set of buffer circuits coupled to receive data signals.

18. The memory device of claim 13, further comprising a buffer control circuit coupled to the plurality of buffer circuits, the buffer control circuit having a first logic circuit configured to enable the output circuits of the first subset of the plurality of buffer circuits responsive to an output enable control signal and further having a second logic circuit configured to enable the output circuits of the second subset of the plurality of buffer circuits responsive to the output enable control signal.

19. A memory device, comprising:
   an address bus;
   a control bus;
   a data bus;
   an address decoder coupled to the address bus;
   a read/write circuit coupled to the data bus;
   a control circuit coupled to the control bus;

a memory-cell array coupled to the address decoder, control circuit, and read/write circuit; and an output buffer coupled to the data bus and the control circuit, the output buffer comprising:

at least one data strobe buffer circuit having an data strobe node at which a read strobe signal is provided and a write strobe signal is received;

a plurality of data buffer circuits, each having a data output node at which a read data signal is provided and a write data signal is received;

at least one resistive termination circuit having resistive terminations coupled to the data strobe node of the at least one data strobe buffer circuit, further having a strobe termination activation node at which a first control signal is applied and configured to enable the resistive terminations coupled to the data strobe node responsive to the first control signal; and a plurality of resistive termination circuits having resistive terminations, each of the plurality of resistive termination circuits coupled to each of the plurality of data buffer circuits, respectively, each further having an I/O termination activation node at which a second control signal is applied and configured to enable the resistive terminations coupled to the data output nodes of each data buffer circuit responsive to the second control signal.

20. The memory device of claim 19, further comprising a termination control circuit having:

a first logic circuit having input nodes at which the a termination mode select signal and a termination control signal are applied and further having an output node coupled to the strobe termination activation node, the first logic circuit configured to generate an active first control signal in response to a first or second state of the termination mode select signal and an active termination control signal; and a second logic circuit having input nodes at which the termination mode select signal and the termination control signal are applied and further having an output node coupled to the output termination activation node, the second logic circuit configured to generate an active second control signal in response to the first state of the termination mode select signal and the active termination control signal and generate an inactive second control signal in response to the second state of the termination mode select signal and the active termination control signal.

21. The memory device of claim 20 wherein the plurality of data buffer circuits of the output buffer comprises at least one data buffer circuit including a test circuit having a test control node at which a test control signal is applied and further having a test input node to which a test input signal is applied, the test circuit configured to couple the test input node to the data output node in response to the test control signal.

22. The memory device of claim 21, further comprising test logic circuit having an input node at which the termination mode select signal is applied and an output coupled to the test control node of the buffer circuit having the test circuit to enable the test circuit in response to the second state of the termination mode select signal.

23. A computer system, comprising:
a data input device;
a data output device;
a processor coupled to the data input and output devices; and a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit;
an output buffer coupled to the data bus and the control circuit, the output buffer comprising:
a plurality of buffer circuits, each buffer circuit having an input circuit and an output circuit, and further having a termination circuit coupled to the input and output circuits, the termination circuit having an activation node to which an activation signal is coupled to enable and disable the termination circuit; and
a termination control circuit coupled to the plurality of buffer circuits and having a mode select node to which a mode select signal is applied and a control node to which a control signal is applied, in response to a first state of the mode select signal and an active control signal, the termination control circuit configured to generate an active activation signal for the plurality of buffer circuits, and in response to a second state of the mode select signal and an active control signal, the termination control circuit further configured to generate an active activation signal for a first subset of the plurality of buffer circuits and an inactive activation signal for a second subset of the plurality of buffers circuit.

24. The computer system of claim 23 wherein the termination control circuit of the output buffer comprises:

a first logic circuit having input nodes at which the mode select signal and the control signal are applied and further having an output node coupled to the activation nodes of the first subset of the plurality of buffer circuits, the first logic circuit configured to generate an active activation signal for the first subset of the plurality of buffer circuits in response to the second state of the mode select signal and an active control signal; and a second logic circuit having input nodes at which the mode select signal and the control signal are applied and further having an output node coupled to the activation nodes of the second subset of the plurality of buffer circuits, the second logic circuit configured to generate an inactive activation signal for the second subset of the plurality of buffer circuits in response to the second state of the mode select signal and an active control signal.

25. The computer system of claim 23 wherein the second subset of the plurality of buffer circuits of the output buffer comprises at least one buffer circuit having a test circuit having a test control node at which a test control signal is applied and further having a test input node to which a test input signal is applied, the test circuit configured to couple the test input node to the output circuit in response to the test control signal.

26. The computer system of claim 25 wherein the memory device further comprises a test logic circuit having an input node at which the mode select signal is applied and an output coupled to the test control node of the buffer circuit having the test circuit to enable the test circuit in response to the second state of the mode select signal.

27. The computer system of claim 23 wherein the first subset of the plurality of buffer circuits of the output buffer comprises a set of buffer circuits coupled to receive data strobe signals and the second subset of the plurality of buffer circuits comprises a set of buffer circuits coupled to receive data signals.

28. The computer system of claim 23 wherein the memory device further comprises a buffer control circuit coupled to the plurality of buffer circuits, the buffer control circuit having a first logic circuit configured to enable the output circuits of the first subset of the plurality of buffer circuits responsive to an output enable control signal and further having a second logic circuit configured to enable the output circuits of the second subset of the plurality of buffer circuits responsive to the output enable control signal.

29. A computer system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit;
an output buffer coupled to the data bus and the control circuit, the I/O buffer comprising:
at least one data strobe buffer circuit having an data strobe node at which a read strobe signal is provided and a write strobe signal is received;
a plurality of data buffer circuits, each having a data output node at which a read data signal is provided and a write data signal is received;
at least one resistive termination circuit having resistive terminations coupled to the data strobe node of the at least one data strobe buffer circuit, further having a strobe termination activation node at which a first control signal is applied and configured to enable the resistive terminations coupled to the data strobe node responsive to the first control signal; and
a plurality of resistive termination circuits having resistive terminations, each of the plurality of resistive termination circuits coupled to each of the plurality of data buffer circuits, respectively, each further having an I/O termination activation node at which a second control signal is applied and configured to enable the resistive terminations coupled to the data output nodes of each data buffer circuit responsive to the second control signal.

30. The computer system of claim 29 wherein the memory device further comprises a termination control circuit having
a first logic circuit having input nodes at which the a termination mode select signal and a termination control signal are applied and further having an output node coupled to the strobe termination activation node, the first logic circuit configured to generate an active first control signal in response to a first or second state of the termination mode select signal and an active termination control signal; and
a second logic circuit having input nodes at which the termination mode select signal and the termination control signal are applied and further having an output node coupled to the output termination activation node, the second logic circuit configured to generate an active second control signal in response to the first state of the termination mode select signal and the active termination control signal and generate an inactive second control signal in response to the second state of the termination mode select signal and the active termination control signal.

31. The computer system of claim 30 wherein the plurality of data buffer circuits of the output buffer comprises at least one data buffer circuit including a test circuit having a test control node at which a test control signal is applied and further having a test input node to which a test input signal is applied, the test circuit configured to couple the test input node to the data output node in response to the test control signal.

32. The computer system of claim 31 wherein the memory device further comprises a test logic circuit having an input node at which the termination mode select signal is applied and an output coupled to the test control node of the buffer circuit having the test circuit to enable the test circuit in response to the second state of the termination mode select signal.

33. A method of configuring resistive terminations for a plurality of output buffer circuits, comprising:
in a first mode, enabling and disabling the resistive terminations for the plurality of output buffer circuits in response to a control signal; and
in a second mode, disabling at least one resistive termination for a first subset of the plurality of output buffer circuits and enabling and disabling the resistive terminations for a second subset of the plurality of output buffer circuits in response to the control signal.

34. The method of claim 33 wherein the first subset of the plurality of output buffer circuits comprises a set of data buffer circuits and the second subset of the plurality of output buffer circuits comprises a set of data strobe buffer circuits.

35. The method of claim 33 wherein enabling and disabling the resistive terminations for the plurality of output buffer circuits comprises coupling a pair of series-coupled impedance devices between a first and a second voltage.

36. The method of claim 33 wherein the first mode comprises a normal operating mode and the second mode comprises a test mode.

37. A method of controlling termination circuits of first and second sets of buffer circuits, comprising:
enabling and disabling a termination circuit of at least one of the first set of buffer circuits in response to a set of control signals; and
enabling and disabling a termination circuits of at least one of the second set of buffer circuits in response to the set of control signals, the termination circuit of the at least one of the first set of buffer circuits not responding to the set of control signals identically as the termination circuit of the at least one of the second set of buffer circuits to the set of control signals.

38. The method of claim 37 wherein enabling and disabling the termination circuits of the first and the second set of buffer circuits comprises coupling a pair of series-coupled impedance devices to a first and second voltage.

39. The method of claim 37 wherein enabling and disabling the termination circuit of the at least one of the first set of buffer circuits comprises enabling and disabling the termination circuit of the at least one of the first set of buffer circuits responsive to an activation signal for both a first state and a second state of the set of control signals, and wherein enabling and disabling the termination circuit of the at least one of the second set of buffer circuits responsive to the activation signal for the first state of the set of control signals and disabling the termination circuit of the at least one of the second set of buffer circuits for the second state of the set of control signals.

40. The method of claim 37, further comprising enabling a test mode for the at least one of the second set of buffer circuits in response to the second state of the set of control signals.

41. The method of claim 37 wherein enabling and disabling the termination circuit of the at least one of the first set of buffer circuits in response to a set of control signals comprises providing the set of control signals to a first logic circuit, and enabling and disabling the termination circuits of at least one of the second set of buffer circuits in response to the set of control signals comprises providing the set of control signals to a second logic circuit.

42. The method of claim 37 wherein enabling and disabling the termination circuit of the at least one of the first set of buffer circuits comprises enabling and disabling the termination circuit of at least one data strobe buffer circuit of a set of data strobe buffer circuits and wherein enabling and disabling the termination circuits of at least one of the second set of buffer circuits comprises enabling and disabling the termination circuit of at least one data buffer circuit of a set of data buffer circuits.

* * * * *